US008860402B2

(12) United States Patent
Jackson et al.

(10) Patent No.: US 8,860,402 B2
(45) Date of Patent: Oct. 14, 2014

(54) ELECTROMAGNETIC FIELD DETECTION SYSTEMS AND METHODS

(75) Inventors: David Blake Jackson, Excelsior, MN (US); Greg Fuchs, River Falls, WI (US); Frederick R. Faxvog, Long Lake, MN (US); Terrence R. Noe, Sebastopol, CA (US)

(73) Assignee: Emprimus, LLC, St. Louis Park, MN (US)

( * ) Notice: Subject to any disclaimer, the term of this patent is extended or adjusted under 35 U.S.C. 154(b) by 1001 days.

(21) Appl. No.: 12/906,912

(22) Filed: Oct. 18, 2010

(65) Prior Publication Data

US 2011/0092181 A1    Apr. 21, 2011

Related U.S. Application Data

(60) Provisional application No. 61/252,540, filed on Oct. 16, 2009, provisional application No. 61/292,118, filed on Jan. 4, 2010.

(51) Int. Cl.
| | |
|---|---|
| *G01R 15/18* | (2006.01) |
| *G01R 19/20* | (2006.01) |
| *G01R 15/20* | (2006.01) |
| *G01R 29/08* | (2006.01) |

(52) U.S. Cl.
CPC ............ *G01R 29/8014* (2013.01); *G01R 19/20* (2013.01); *G01R 15/185* (2013.01); *G01R 29/0878* (2013.01)
USPC ........................... 324/117 R; 324/72; 324/144

(58) Field of Classification Search
CPC ........... G01R 29/0814; G01R 29/0878; G01R 33/10; G01R 33/02; G01V 3/081; G06F 3/046; G01D 5/145
USPC ........................... 324/72, 117 R, 144
See application file for complete search history.

(56) References Cited

U.S. PATENT DOCUMENTS

| | | | |
|---|---|---|---|
| 3,763,419 | A | 10/1973 | Barringer |
| 4,238,030 | A | 12/1980 | Maylandt |

(Continued)

FOREIGN PATENT DOCUMENTS

| | | |
|---|---|---|
| FR | 2 919 069 A1 | 1/2009 |
| WO | WO 2008/117635 A1 | 10/2008 |

OTHER PUBLICATIONS

"Integrated DC Logarithmic Amplifiers," Maxim Integrated Products, Application Note 3611, pp. 1-13 (Sep. 23, 2005).*

(Continued)

*Primary Examiner* — Patrick Assouad
*Assistant Examiner* — Sean Curtis
(74) *Attorney, Agent, or Firm* — Merchant & Gould P.C.

(57) ABSTRACT

Detectors and other apparatus for determining the presence of electromagnetic events are disclosed. One such system includes an electromagnetically shielded enclosure and a detector configured to detect an electromagnetic field event occurring in the proximity of the enclosure. The detector includes an antenna and a circuit electrically connected to the antenna. The circuit includes electronics communicatively connected to the antenna via a direct current isolation circuit, and an equalizer compensating for the differentiating frequency response of the antenna. The circuit also includes a logarithmic amplifier electrically connected to the equalizer and configured to generate a range of signals based on signals received at the antenna, and a peak detector receiving signals from the logarithmic amplifier and configured to capture a peak value of the signals. An electromagnetic field event is detected at least in part based on the peak signal value.

25 Claims, 11 Drawing Sheets

(56) References Cited

U.S. PATENT DOCUMENTS

| | | | |
|---|---|---|---|
| 4,631,473 | A | 12/1986 | Honda |
| 4,876,551 | A | 10/1989 | Climent et al. |
| 5,231,346 | A | 7/1993 | Gassmann |
| 5,414,366 | A * | 5/1995 | Rogers .................. 324/627 |
| 5,500,586 | A | 3/1996 | Youngquist |
| 5,512,823 | A * | 4/1996 | Nepveu .................. 324/258 |
| 5,574,805 | A | 11/1996 | Toba et al. |
| 5,682,164 | A | 10/1997 | McEwan |
| 5,773,974 | A | 6/1998 | Kraz |
| 5,856,803 | A | 1/1999 | Pevlera |
| 5,877,630 | A | 3/1999 | Kraz |
| 5,892,690 | A | 4/1999 | Boatman et al. |
| 5,903,220 | A | 5/1999 | Jon et al. |
| 5,923,160 | A | 7/1999 | DeChiaro et al. |
| 6,025,807 | A | 2/2000 | Jon et al. |
| 6,035,186 | A | 3/2000 | Moore et al. |
| 6,052,040 | A | 4/2000 | Hino |
| 6,144,341 | A | 11/2000 | Kraz |
| 6,175,808 | B1 | 1/2001 | Chai |
| 6,184,693 | B1 | 2/2001 | Arai et al. |
| 6,456,070 | B1 | 9/2002 | Kazama et al. |
| 6,738,008 | B1 | 5/2004 | Liu et al. |
| 6,782,351 | B2 | 8/2004 | Reichel et al. |
| 6,782,971 | B2 | 8/2004 | Dutton et al. |
| 6,975,111 | B2 | 12/2005 | Kazama et al. |
| RE38,985 | E | 2/2006 | Boatman et al. |
| 6,995,728 | B2 | 2/2006 | Rodriguez |
| 7,098,677 | B2 | 8/2006 | Kazama et al. |
| 7,167,133 | B2 | 1/2007 | Nagashima |
| 7,210,557 | B2 | 5/2007 | Phillips et al. |
| 7,317,319 | B2 | 1/2008 | Kazama |
| 7,358,749 | B2 | 4/2008 | Kazama et al. |
| 7,459,917 | B2 | 12/2008 | Kazama |
| 7,599,815 | B2 | 10/2009 | Reichel et al. |
| 7,610,810 | B2 | 11/2009 | Winker |
| 7,801,242 | B2 | 9/2010 | Garmany et al. |
| 8,476,900 | B2 * | 7/2013 | Fan et al. .................. 324/260 |
| 8,552,722 | B2 * | 10/2013 | Lionheart et al. .......... 324/258 |
| 2004/0021463 | A1 | 2/2004 | Miyazawa et al. |
| 2004/0071241 | A1 | 4/2004 | Bouillet et al. |
| 2005/0104768 | A1 | 5/2005 | Johnston |
| 2006/0092022 | A1 | 5/2006 | Cehelnik |
| 2006/0153284 | A1 | 7/2006 | Souissi et al. |
| 2006/0206273 | A1 | 9/2006 | Reichel et al. |
| 2006/0220635 | A1 | 10/2006 | Kazama et al. |
| 2007/0066877 | A1 * | 3/2007 | Arnold et al. .................. 600/315 |
| 2007/0099583 | A1 | 5/2007 | Vaisanen |
| 2007/0176599 | A1 | 8/2007 | Funato |
| 2007/0298724 | A1 | 12/2007 | Sulkowski, Jr. et al. |
| 2008/0050172 | A1 | 2/2008 | Simola et al. |
| 2008/0100510 | A1 | 5/2008 | Bonthron et al. |
| 2008/0197982 | A1 | 8/2008 | Sadr |
| 2008/0238567 | A1 | 10/2008 | Rosetti et al. |
| 2008/0252535 | A1 | 10/2008 | Parsche |
| 2009/0041106 | A1 | 2/2009 | Perez et al. |
| 2009/0058554 | A1 | 3/2009 | Ozden |
| 2009/0228240 | A1 | 9/2009 | Makela et al. |
| 2009/0302834 | A1 | 12/2009 | Diaz et al. |
| 2009/0302864 | A1 | 12/2009 | Marinov |
| 2009/0309736 | A1 | 12/2009 | Heurtier |
| 2010/0120369 | A1 | 5/2010 | Ko et al. |
| 2010/0289711 | A1 | 11/2010 | Boyle |
| 2011/0089929 | A1 | 4/2011 | Jackson et al. |

OTHER PUBLICATIONS

International Search Report and Written Opinion for PCT/US2010/053049 mailed Oct. 19, 2011.

"2.5GHz 45dB RF-Detecting Controllers," *Maxim Integrated Products*, pp. 1-19 (Dec. 2007).

Invitation to Pay Additional Fees with Partial International Search mailed Jun. 21, 2011.

International Search Report and Written Opinion mailed Jun. 24, 2011.

Jackson et al., High Dynamic Range, Wide Bandwidth Electromagnetic Field Threat Detector, 9 Pages. (unpublished; expected Pub. Date: 2014).

Interview Summary of telephonic interview held on Jan. 14, 2014, for U.S. Appl. No. 12/906,902 (3 pages).

Notice of Allowance and Notice of Allowability for U.S. Appl. No. 12/906,902 mailed Feb. 28, 2014 (16 pages).

* cited by examiner

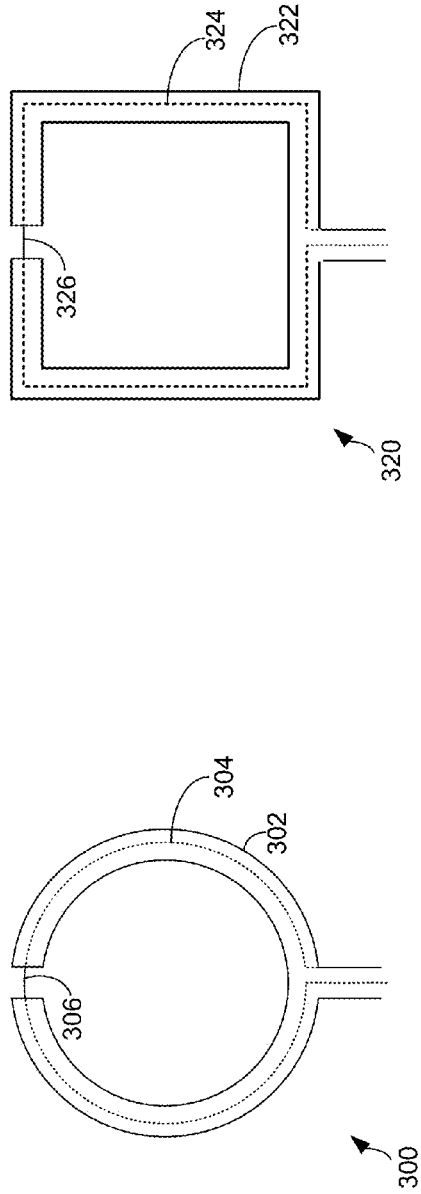
Figure 3A
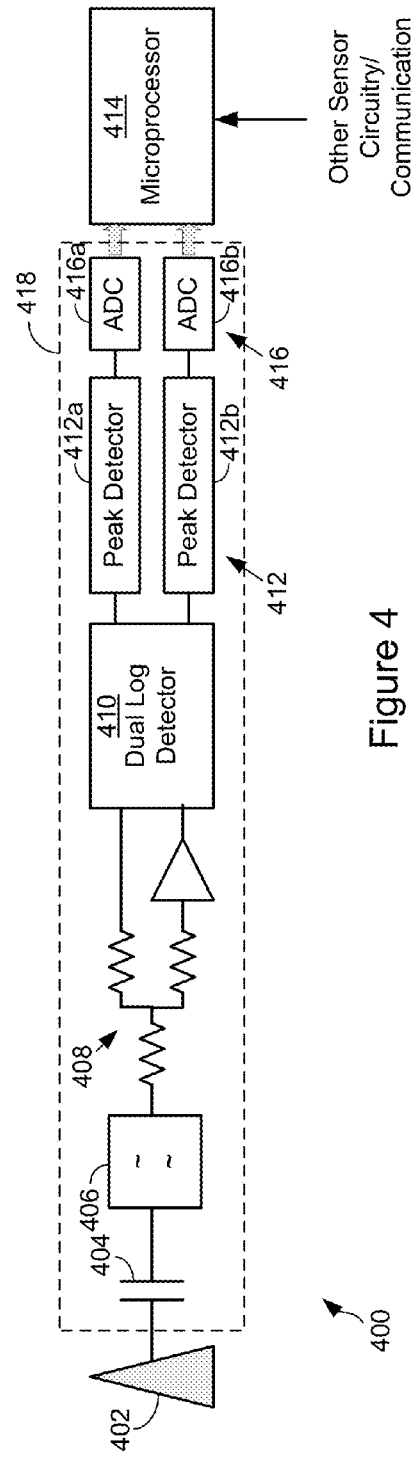
Figure 3B
Figure 4

ELECTROMAGNETIC FIELD DETECTION SYSTEMS AND METHODS

CROSS-REFERENCE TO RELATED APPLICATIONS

The present application claims priority to U.S. Provisional Patent Application No. 61/252,540, filed Oct. 16, 2009, and U.S. Provisional Patent Application No. 61/292,118, filed Jan. 4, 2010, the disclosures of which are hereby incorporated by reference in their entireties.

TECHNICAL FIELD

The present disclosure relates to detection of electromagnetic fields. In particular, the present disclosure relates to both systems and methods for electromagnetic field detection.

BACKGROUND

Exposure to electromagnetic fields can cause interference or damage to electronic equipment, causing that equipment to malfunction or rendering it nonoperational. This is particularly a risk in the case of sensitive computing system data, which can be corrupted or lost in the event of a strong electromagnetic pulse or intentional electromagnetic interference event (EMP/IEMI).

EMP/IEMI events typically take one of two forms. First, high field events correspond to short-duration, high voltage events (e.g., up to and exceeding 100 kilovolts per meter), and typically are of the form of short pulses of narrow-band or distributed signals (e.g., in the frequency range of 1 MHz to 10 GHz). These types of events typically generate high voltage differences in equipment, leading to high induced currents and burnout of electrical components. Second, low field events (e.g., events in the range of 0.01 to 10 volts per meter) are indications of changing electromagnetic environments below the high field damaging environments.

Existing electromagnetic systems use electrical antennas to detect the existence of a high-field or low-field event. For example, electrical dipole antennae, D dot detectors, or electro-optical detectors can be used. Electrical dipole antennae typically operate using a Schottky-type diode detector system, which receives signals directly based on the induced voltage at the antenna. D dot detectors measure the time rate of change of electrical displacement, and deduce the electrical field strength at an antenna by integrating the time rate of change of an electrical field over a set amount of time. As such, these detectors also operate directly on the electrical field. Electro-optical detectors use changes of an index of refraction in a solid or liquid based on the presence of an electromagnetic field.

These systems have drawbacks. This is because each of the above types of antennas and associated circuitry either cannot respond to events across the entire expected signal range of high field and low field events, or is too expensive or unreliable for use with certain events. In the case of a high field event (e.g., a high voltage pulse or other event having a large signal intensity, as explained above), the various electrical antennae described above observe a large electrical field, resulting in a large induced voltage on the antenna. Additionally, common mode current flowing on the outer surface of an antenna probe or attached cable can cause unpredictable variations in the output power or voltage produced by the antenna. This can cause potential damage to downstream circuitry. Even in the case of low field events, it can be difficult to adequately capture events over the entire signal range of expected frequencies (e.g., 1 MHz to 10 GHz). Furthermore, it can be difficult to manage a high voltage antenna configuration in the proximity to sensitive electronic equipment to be protected, particularly if that electronic equipment is intended to be shielded from large electronic signals.

For these and other reasons, improvements are desirable.

SUMMARY

In accordance with the following disclosure, the above and other issues are addressed by the following:

In a first aspect, a system includes an electromagnetically shielded enclosure and a detector configured to detect an electromagnetic field event occurring in the proximity of the enclosure. The detector includes an antenna and a circuit electrically connected to the antenna. The circuit includes an equalizer communicatively connected to the antenna via a direct current isolation circuit, the equalizer compensating for differentiating frequency response of the antenna. The circuit also includes a logarithmic amplifier electrically connected to the equalizer and configured to generate a range of signals based on signals received at the antenna, and a peak detector receiving signals from the logarithmic amplifier and configured to capture a peak value of the signals. An electromagnetic field event is detected at least in part based on the peak value.

In a second aspect, an electromagnetic event detection apparatus includes a circuit configured to detect an electromagnetic event, as well as a housing at least partially enclosing the circuit. The circuit includes an equalizer communicatively connected to an antenna via a direct current isolation circuit, the equalizer compensating for differentiating frequency response of the antenna. The circuit also includes a logarithmic amplifier electrically connected to the equalizer and configured to generate a range of signals based on signals received at the antenna. The circuit further includes a peak detector receiving signals from the logarithmic amplifier and configured to capture a peak value of the signals, and a microprocessor configured to detect an electromagnetic field events at least in part based on the peak value; and In a third aspect, an electromagnetic detector system includes a plurality of detectors positioned at a plurality of locations at a facility. Each of the plurality of detectors includes an antenna and a circuit electrically connected to the antenna. Each circuit includes an equalizer communicatively connected to the antenna via a direct current isolation circuit and equalizer compensating for differentiating frequency response of the antenna. Each circuit also includes a logarithmic amplifier electrically connected to the equalizer and configured to generate a range of signals based on signals received at the antenna. Each circuit further includes a peak detector receiving signals from the logarithmic amplifier and configured to capture a peak value of the signals. The electromagnetic detector system also includes a detection system communicatively connected to each of the plurality of detectors, the detection system including one or more computing systems configured to receive information from the plurality of detectors regarding observed electromagnetic fields and further configured to detect the presence of an electromagnetic event at one or more of the detectors.

BRIEF DESCRIPTION OF THE DRAWINGS

FIG. 3A is an example antenna useable to detect high field pulses, according to a possible embodiment of the present disclosure;

FIG. 3B is an example antenna useable to detect high field pulses, according to a second possible embodiment of the present disclosure;

FIG. 4 is an example schematic block diagram of a circuit useable to detect high or low electromagnetic fields, according to a possible embodiment of the present disclosure;

DETAILED DESCRIPTION

Figure 1:
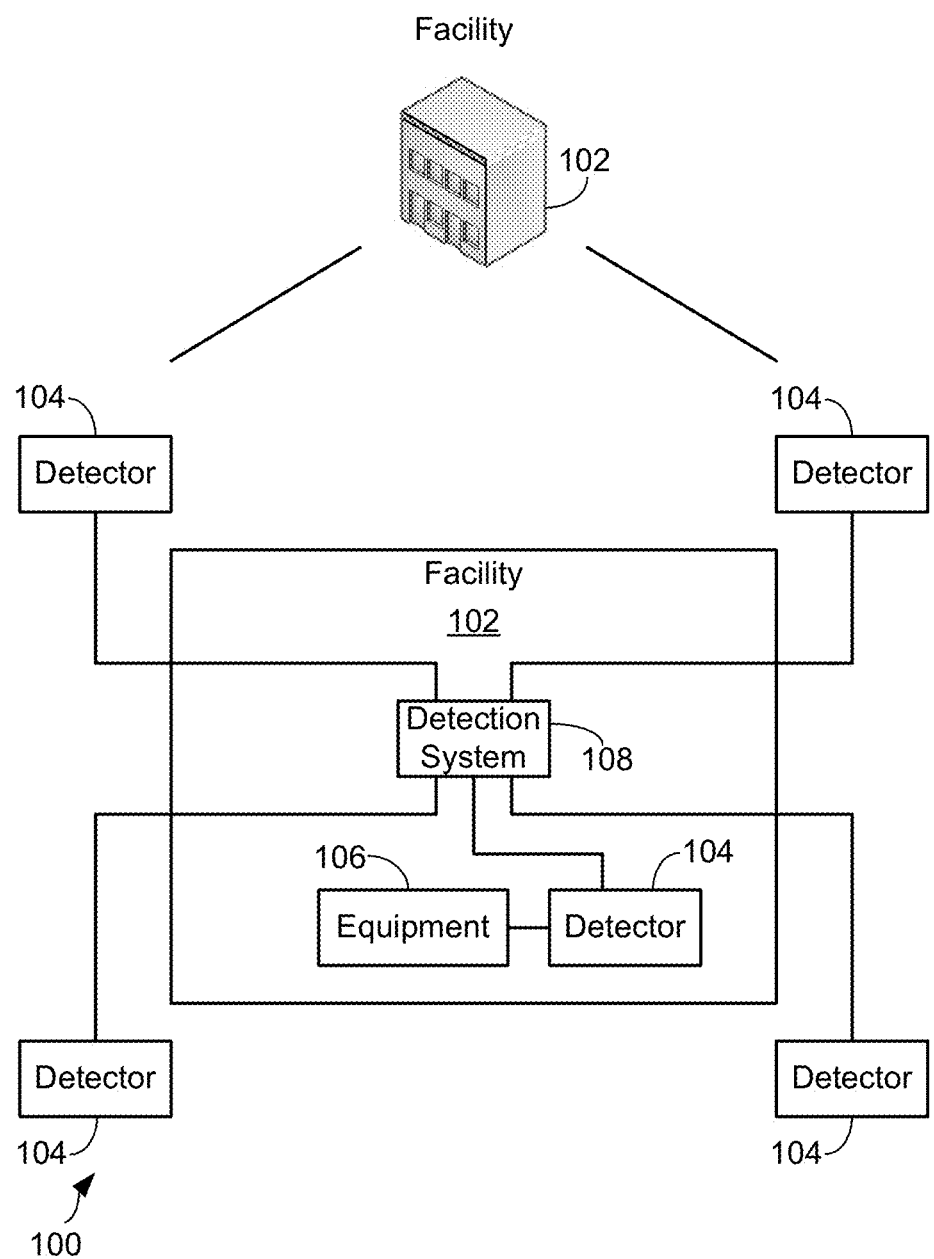
FIG. 1 is an example block schematic diagram of an electromagnetic detector system deployed at a facility.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure relates to methods and systems for detecting electromagnetic fields, and in particular types of electromagnetic fields that are capable of causing damage to electronic equipment. The present disclosure particularly involves detection and capture of high field and low field EMP/IEMI events, to allow systems to determine the type of event occurring and the particular state of the electronic equipment at the time of the event. By combining certain circuits and components with specifically designed enclosures and detection equipment, damage from these types of electromagnetic events can be mitigated.

Specifically, certain aspects of the present disclosure relate to inferentially obtaining an estimated electrical field based on detection of one or more magnetic fields, using a shielded magnetic loop antenna and associated circuitry. Additionally, specific circuits are disclosed that have a fast rise time response and large dynamic range variation in amplitude, which allow those circuits to detect very narrow pulses of various amplitudes, such as are generated during electromagnetic events, such as EMP/IEMI events.

The logical operations of certain aspects of the disclosure described herein are implemented as: (1) a sequence of computer implemented steps, operations, or procedures running on a programmable circuit within a computer, and/or (2) a sequence of computer implemented steps, operations, or procedures running on a programmable circuit within a directory system, database, or compiler.

Referring now to FIG. 1, an example block schematic diagram of an electromagnetic event detector system 100 deployed at a facility 102 is shown. The electromagnetic event detector system 100 includes a plurality of detectors 104 deployed throughout the facility 102. In the embodiment shown, the detectors 104 are deployed along a perimeter of the facility 102, as well as in association with electronic equipment 106 within the facility. As such, the detectors 104 are configured to operate across a variety of temperature ranges and in a variety of weather conditions.

The detectors 104 can take any of a number of forms. In some embodiments, the detectors 104 can be a stand alone high field or low field electromagnetic event detector, as described herein. In such embodiments, the detectors 104 can optionally also include other sensors, such as temperature, carbon monoxide, carbon dioxide, smoke, fire, radiation, or chemical sensors as well. Additionally, one or more different types of detectors can be used at a single facility 102.

In the embodiment shown, each of the detectors 104 is communicatively connected to a detection system 108, which in various embodiments can be a centrally-located, shielded computing system configured to receive signals from the detectors 104. The detection system 108 can analyze the signals received from the detectors and, based on one or more different types of calculations (as described below), can detect the presence of a high field or low field electromagnetic event, such as an EMP/IEMI event. The detection system 108 can also communicate status information regarding electromagnetic events, or observed electrical field readings, to a remote system (not shown) such as a data archival system or for purposes of alarming to a remote monitoring system, or for forensic information.

Optionally, the detection system 108 also periodically determines the state of various computing or electronic systems at the facility 102, such that, upon occurrence of an electromagnetic event, the last-known good status of that electrical or electronic equipment can be determined and restored in case damage has occurred.

Figure 2:
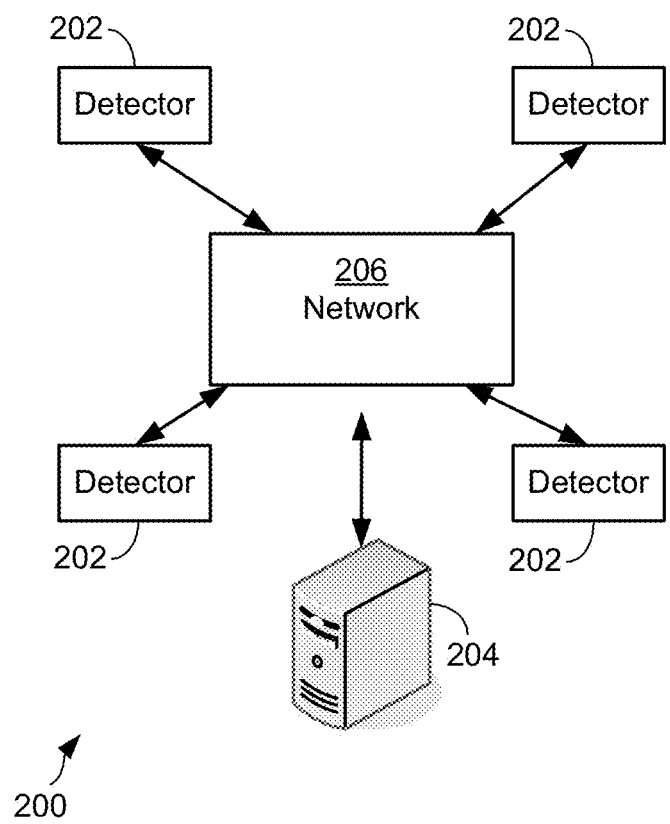
FIG. 2 is an example system for detecting electromagnetic signals, according to a possible embodiment of the present disclosure.

FIG. 2 provides additional details regarding an example system 200 for detecting electromagnetic signals, according to a possible embodiment of the present disclosure. In the embodiment shown, the system 200 includes a number of detectors 202 interconnected with a central detector system 204 by a network 206. In the embodiment shown, a number of detectors 202 are associated with a single central detector system 204, which is generally a computing system configured to receive signals from the detectors relating to peak values of electrical or magnetic signals received at those detectors, and determine whether such values correspond to an electromagnetic event, such as an EMP/IEMI event. In alternative embodiments, each detector 202 can have a dedicated microprocessor or computing system associated with it to detect or determine the existence of an electromagnetic event. Example arrangements of detectors using such an arrangement are illustrated in FIGS. 6-7 and 13-14, described below. In such embodiments, those separate microprocessors or computing systems can also communicate to an external system for example if centralized electromagnetic event logging or management of detectors is desired.

The network 206 can take any of a number of forms. In some embodiments, the network 206 represents a secured communications network or point-to-point network using one or more electrical or fiber optic conduits between the detectors 202 and central detector system 204, using any of a number of standard communications protocols. In certain examples, as described below, connection between a detector 202 and central detector system 204 can be accomplished using an RS-232 electrical connection, or through use of fiber optic cabling (and any of a variety of connectors and protocols). In still other embodiments, the detectors 202 and central detector system 204 can communicate using any of an umber of open networks and standards, such as the Internet. Other embodiments are possible as well.

Using the system 200 to coordinate use of detectors 202 and a central detector system 204, it is possible to determine the direction from which an electromagnetic event is detected, as well as the approximate distance to that electromagnetic event. For example, a central detector system 204 can compute an approximate location of the electromagnetic event based on the differing magnitudes and times at which electrical fields are observed at detectors spaced across a distance, if the locations of those detectors are known, and normal attenuation of the electrical field over free space is assumed.

Referring now to FIGS. 3A-14, additional details regarding specific electromagnetic event detectors are described. The various example detectors and detector components are generally categorized into two types, representing high field detectors and low field detectors. Although it is recognized that one of these types of detectors is particularly designed to sense and detect certain types of electromagnetic events, that detector may also be suitable to detect other events as well. For example, a high field detector may be useable to detect low field events as well, or vice versa.

Referring now to FIGS. 3A-10, various example circuits and components of field detectors are illustrated, as well as example implementations using such a detector. FIGS. 3A and 3B illustrates antennas 300, 320 respectively, useable to detect high field pulses, according to a possible embodiment of the present disclosure. The antennas 300, 320 are, in the embodiments shown, a shielded loop magnetic antenna. For example, in FIG. 3A, the antenna 300 is a generally circular loop antenna having a loop of approximately ¼ inch or less in diameter, and including shielding (e.g., a metal sheath); in FIG. 3B, the antenna 320 is a generally rectangular loop antenna having size of approximately ¼ inch in length. Each antenna includes shielding 302, 322 (represented by solid lines) which extends around each loop 304, 324 (illustrated using dotted lines), and effectively limits induction of an electrical field on the antenna, while making the loops 304, 324 susceptible to magnetic fields. Each antenna also includes an exposed gap portion 306, 326, respectively, at which the magnetic field is induced. In particular embodiments, the antennas 300, 320 can be high field self integrating B dot antennas. Other embodiments are possible as well.

In the embodiments shown, the antennas 300, 320 are configured to output voltages that are directly proportional to the electrical field amplitude that corresponds to the component of the observed magnetic field at a given frequency at the antenna. In certain embodiments, the antennas 300, 320 are configured to output voltages of zero to five volts, depending upon the field strength of the electrical field observed (as inferred from the observed magnetic field strength). Preferably, the antennas 300, 320 have tailored inductance and resistance values to result in output of such voltages and has a sufficiently fast (nanosecond range) response times to detect EMP/IEMI pulse events.

In certain embodiments, the antennas 300, 320 have output amplitudes that in combination with an equalizer are independent of frequency, at least over a predetermined frequency range. In certain embodiments, that frequency range can include about 200 MHz to about 10 GHz; in other embodiments, the frequency range can extend from about 10 MHz to about 10 GHz.

Additionally, although the antennas 300, 320 are described as being approximately ¼ inch in diameter, other sizes or dimensions of antennas are possible as well. By changing the size of the antennas 300, 320, different ranges of frequencies can be detected. The ¼ inch or less antennas described herein are intended to be responsive across the range of frequencies in which EMP/IEMI events occur, as described in the preceding paragraph.

In use, the antennas 300, 320 can each be used to obtain measurements of far field magnetic field measurements to infer electric field intensity, and therefore to detect electromagnetic pulses or other electromagnetic events, as previously described. When placed in a far field from the electromagnetic radiation source (e.g., spaced such that a radiation source is more than several wavelengths away from the antenna), the magnetic field strength detected by the antenna, $\tilde{H}$, is directly correlated to the electric field strength component E by the impedance of free space, approximately 377Ω. This relationship can be represented by the following equation:

$$\tilde{H} = \tilde{E}/377\Omega$$

Using this relationship, a component of the electric field strength can be inferred by measuring a directional magnetic field strength. By vectorially adding such field strengths across all possible directions (e.g., using three antennas positioned normal to each other, as described in FIGS. 5-10, below), an overall electrical field strength can be inferred.

Through use of the antennas 300, 320, electrical field strengths can be inferred for fields of very high intensity, including fields in the range of 100 volts per meter to 100,000 volts per meter without additional attenuation of the inbound signal.

Referring now to FIG. 4, an example schematic block diagram of a circuit 400 is shown that is useable to inferentially detect electromagnetic fields, according to a possible embodiment of the present disclosure. The circuit 400, in the embodiment shown, is configured to be useable in either high field detectors or low field detectors, such that use with either a shielded loop magnetic antenna such as those shown in FIGS. 3A-3B can detect high field electromagnetic events, or use with a standard electrical field sensing monopole or dipole antennas can detect low field electromagnetic events.

The circuit 400, in the embodiment shown, can therefore be used in a number of implementations of electromagnetic event detectors.

In the embodiment shown, the circuit 400 includes an antenna 402, which can, in various embodiments, represent a shielded loop magnetic antenna or other type of antenna, depending upon the particular intended implementation for the circuit 400. Leading from the antenna 402, a direct current circuit block 404 conditions the direct current portion of the signal received at the antenna, such that the detected portion of the received signal only represents the alternating current portion of the signal as induced by a field at the antenna (e.g., a magnetic field at a magnetic loop antenna in the case of high field event detection, or an electrical field at an electrical antenna in the case of low field event detection).

An equalizer 406 connects to the direct current circuit block 404, and compensates for the differentiating characteristics of the signal received at the antenna 402. A resistive attenuator circuit 408 scales the maximum expected antenna output threat voltage to a maximum allowable RF circuitry input voltage at a logarithmic detector 410, thereby preventing overload of the RF circuitry based on input signals received by the antenna 402. For example, if the maximum allowable input voltage for the RF circuitry is 5.5 volts and the maximum expected input voltage is higher, the resistive attenuator circuit 408 is configured to divide down the voltage in linear proportion to ensure that the RF processing circuitry is not damaged by signals received at the antenna.

In the embodiment shown, the resistive attenuator circuit 408 splits the incoming signal into two paths, for lower level signals and higher level signals. The lower level signals are amplified when passed to the logarithmic detector, to ensure that the signals received at the logarithmic detector 410 are in a range where its response is most linear. In certain embodiments, to achieve a dynamic range of over about 60 dB, separated, scaled signals are used that are in the approximately 30-40 dB range.

The logarithmic detector 410 receives signals from the resistive attenuator circuit 408, and provides a dynamic range of values to a peak detector 412. Specifically, the logarithmic detector 410 demodulates an RF input signal and outputs a baseband voltage proportional to the log of the input power. In certain embodiments, the logarithmic detector can be an ADL 5519 dual logarithmic detector, from Analog Devices, Inc. of Norwood, Mass. Other logarithmic amplifies can include, for example, an AD8319 logarithmic amplified from Analog Devices, or a LT 5334 from Linear Technologies of Milpitas, Calif. Other logarithmic amplifiers could be used as well, depending upon the particular timing and expected signals received by the detector at the antenna 402.

The multi-stage peak detector 412 captures peak values of signals output from the logarithmic detector 410. Preferably, the peak detector has a fast rise time (e.g., less than about 3 ns) sufficient to capture narrow pulse EMP/IEMI events, and a sufficiently long hold time to allow a slower periodic sampling of that peak value. In certain embodiments, the rise time of the peak detector can detect signals as quickly as approximately 3 nanoseconds, and can hold that signal value for approximately 60 microseconds or longer (allowing kilohertz-level sampling frequencies of the peak detector, despite the narrow nature of EMP/IEMI events). In the embodiment shown, the peak detector 412 is a two-stage peak detector; however, other designs of peak detectors are possible as well. Additionally, in the embodiment shown, two peak detectors 412a-b are used, one for the higher-level signals and one for the lower-level signals received at the logarithmic detector 410. When the values captured by the peak detector 412 are obtained (e.g., by a microprocessor, as described below), the higher of the scaled signals is selected for determining a value of the electrical field (or an inferred value of a component of the electrical field, in the case of a high field detector arrangement).

A microprocessor 414 receives captured readings from the peak detector 412 via one or more analog to digital converters 416 (illustrated as analog to digital converters 416a-b), which format the analog output of the peak detector for use by the microprocessor. Based on the observed signal value captured by the peak detector, the microprocessor can determine the existence of an electromagnetic event (e.g. an EMP/IEMI event) according to any of a number of particular algorithms. In one example, the observed signal value is compared to a predetermined value representing harmful electromagnetic The microprocessor 414 can perform a number of additional functions, beyond determination of electromagnetic events. For example, the microprocessor can, in certain embodiments, generate alarms or other notifications based on the determination of electromagnetic events. The microprocessor can also periodically store the state of one or more other electronic systems, such that a last known good time of a particular piece of electronic equipment can be known in the event of detection of an electromagnetic event, and can be logged alongside the existence of that electromagnetic event. Additionally, other data logging and security functions can be performed, and other sensor or detector values can be captured and logged. Other sensors can include, for example, smoke or fire sensors, gas sensors, sound or light sensors, chemical sensors, or other types of sensors.

Referring to the circuit 400 overall, it is recognized the specific values used for resistors in the resistive attenuator circuit 408 can vary according to different embodiments of the present disclosure. In certain embodiments, the range of monitored field strengths can be adjusted by changing the amount of attenuation provided by the resistive attenuator circuit 408, thereby presenting a lower or higher input voltage to the logarithmic detector 410 and peak detector 412.

It is further recognized that the portion of the circuit 400 from the direct current circuit block 404 to the peak detector(s) 412 can be replicated as a standard block 418, to allow use with different antennas, while using a common microprocessor for determining the present of an electromagnetic event. Examples in which such an arrangement is used are provided in connection with the high field designs of FIGS. 6-7, described below.

Figure 5:
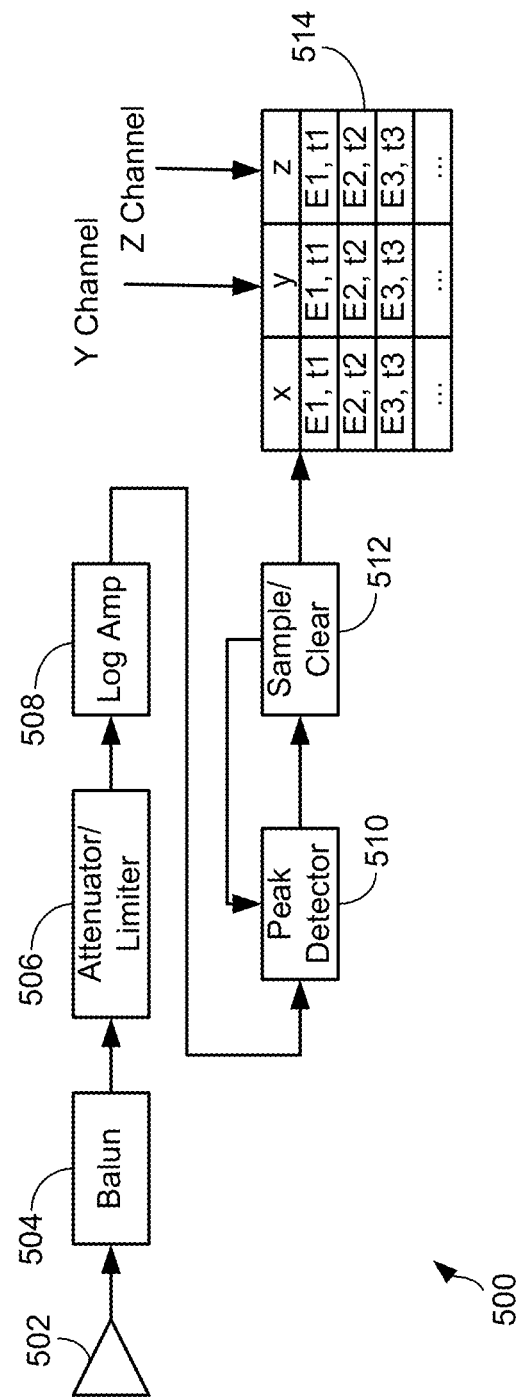
FIG. 5 is an example schematic block diagram of a circuit useable to detect high field electromagnetic fields, according to a further possible embodiment of the present disclosure.

FIG. 5 is an example schematic block diagram of a circuit 500 useable to detect high field electromagnetic fields, according to a further possible embodiment of the present disclosure. The circuit 500 represents a particular implementation of the circuit described above in connection with FIG. 4, particularly suited to high field event detection.

In the embodiment shown, the circuit 500 includes an antenna 502, which, according to the various embodiments described herein relating to high field detection, can be a shielded loop magnetic antenna. A balun 504 performs signal conditioning on the received magnetic signals, and passes those signals to an attenuator/limiter circuit 506. The attenuator/limiter circuit 506 generally corresponds to the resistive attenuator circuit 408 of FIG. 4, above. A logarithmic amplifier 508 and peak detector 510 are analogous to those elements 410, 412 of FIG. 4 as well.

A sample and clear circuit 512 can be included in the circuit 500 to read the signals captured by the peak detector 510. In certain embodiments, the sample and clear circuit 512 can include an analog to digital converter and programmable circuit, such as the A/D converter 416 and microprocessor 414 of FIG. 4.

As recognized by comparing the portion of the circuit 500 from the balun 504 through the sample and clear circuit 512, this generally corresponds to and would be useable interchangeably with the standard block 418 of FIG. 4. In the embodiment shown, which is particularly used in association with high field events, the samples collected at the sample and clear circuit 512 relate to inferred electrical field components from a magnetic field having a particular orientation.

To ensure that all directions are encompassed, two additional circuit sections and antennas can be used, with the antennas placed in an arrangement where each antenna is oriented normal to the orientation of the other two antennas, (e.g., forming a three-dimensional axis), in which a first antenna captures an "x" component of a magnetic field, a second antenna captures a "y" component of the magnetic field, and a third antenna captures a "z" component of the magnetic field. As illustrated, a microcontroller 514 collects sample readings from each of these circuit sections (i.e., respective sample and clear circuits 512 associated with each oriented antenna), and infers an overall electrical field strength based on the observed three components of the magnetic field. In particular, the total electrical field estimate can be represented by the square root of the sum of squares of the directional electrical field estimates, as represented by the following equation:

$$E_T = \sqrt{E_x^2 + E_y^2 + E_z^2}$$

The value of $E_T$ can be periodically transmitted to a remote system for further processing, or can be analyzed to determine the existence of a high field electromagnetic event (e.g., an EMP/IEMI event). In an alternative embodiment in which accurate electrical field amplitude is less critical than simply determining the existence of a pulse, simply summing the constituent directional electrical fields can be performed.

Figure 6:
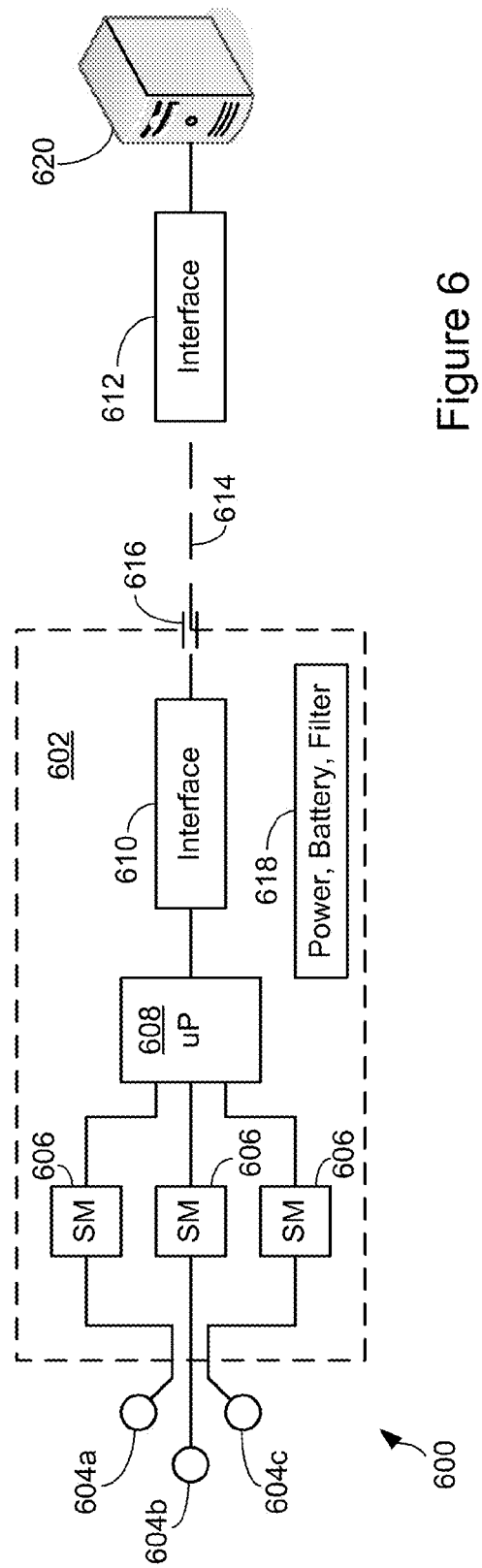
FIG. 6 is a schematic block diagram of a high field electromagnetic pulse detection system including a high field detector apparatus, according to a possible embodiment of the present disclosure.
Figure 7:
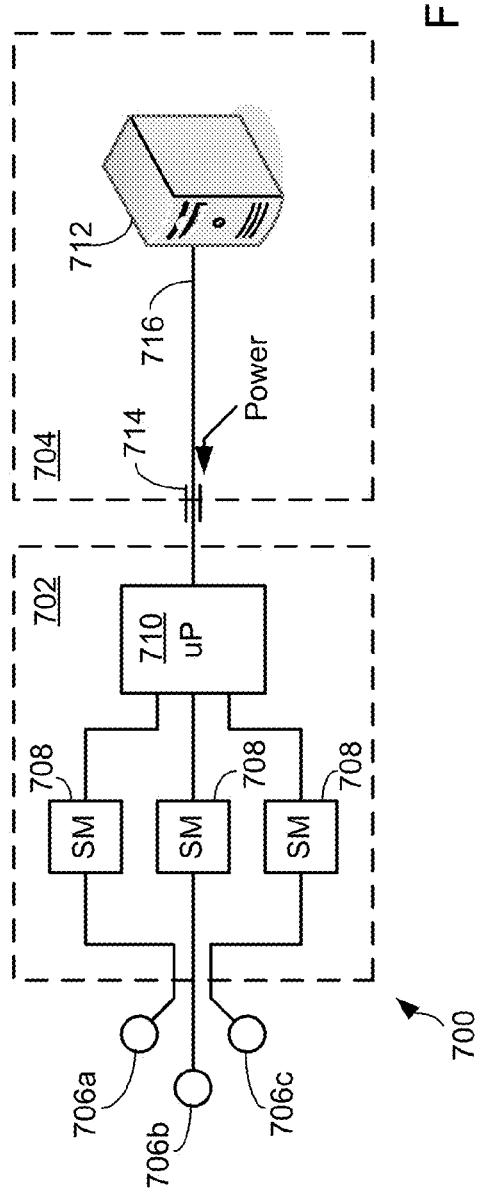
FIG. 7 is a schematic block diagram of a high field electromagnetic pulse detection system incorporated into a shielded enclosure, according to a possible embodiment.

Referring now to FIGS. 6-7, schematic block diagrams of high field electromagnetic pulse detection systems are disclosed. The schematic block diagrams illustrate example arrangements in which high field electromagnetic pulse detection systems can be implemented, although others are possible as well.

FIG. 6 illustrates a high field electromagnetic pulse detection system 600 including a high field detector apparatus 602, which in the embodiment shown represents a stand-alone component. As such, the high field detector apparatus 602 can correspond to a detector, such as those illustrated in FIGS. 1-2, above.

The high field electromagnetic pulse detection system 600 includes a plurality of shielded loop magnetic antennas. In the embodiment shown, the system 600 includes three shielded loop magnetic antenna 604a-c, each oriented to capture magnetic signals along a different axis, such that each antenna 604a-c is oriented normal to a plane formed by the other two antennas.

Signals from each of the antennas 604a-c are fed into the high field detector apparatus 602, which includes three corresponding standard circuit blocks 606. In various embodiments, the standard circuit blocks 606 can correspond to the standard block 418 of FIG. 4, or corresponding block of circuitry described in FIG. 5, above. The output of each of the standard circuit blocks 606 is fed to a microprocessor 608 within the high field detector apparatus 602, which can determine the existence of a high field event, log such events, or otherwise capture information relevant to the existence of such events (e.g., state information). The high field detector apparatus 602 includes a communication interface 610 which converts signals from the microprocessor 608 (e.g., RS-232 formatted signals, or other differential or digital signals) and converts those signals for communication external to the high field detector apparatus 602. In an example embodiment, the communication interface 610 converts the signals to fiber optic signals, and communicates with a complementary, remote communication interface 612 via a fiber connection 614. To prevent interference by the high electromagnetic event on the fiber connection 614, a waveguide beyond cutoff 616 can be included at the boundary of the housing of the high field detector apparatus 602 to ensure that internal components of that apparatus are not damaged. In such arrangements, the high field detector apparatus 602 also has an electromagnetically shielded housing (e.g., represented by the dotted line 602), preventing the high field event from damaging the apparatus 602 itself. The high field detector apparatus 602 also includes a maintenance block 618, which can provide power, backup battery, and power filtering functionality for the detector apparatus 602.

From the remote communication interface 612, captured data relating to high field events can be communicated to a computing system 620, which can log or analyze those events, combine data relating to those events with data from other types of sensing systems, communicate that data to a central detector system via an Internet connection or other networked connection, or otherwise manage the collected data.

Referring to the high field electromagnetic pulse detection system 600 overall, it is recognized that although a single high field detector apparatus 602 and computing system 620 are illustrated, arrangements of the system are possible in which multiple high field detector apparatus 602 could be associated with a single computing system, or multiple computing systems, depending upon the detection location requirements and computing resources required to monitor those detectors.

FIG. 7 illustrates a high field electromagnetic pulse detection system 700 that includes a high field detector 702 incorporated alongside a shielded enclosure 704. This arrangement may be particularly useful for detector systems used at a facility when placed in close proximity to sensitive computing systems or other electronics (e.g., the detector illustrated in FIG. 1 as associated with electronics at the facility 102). In this embodiment, a plurality of antennas 706a-c lead to standard blocks 708, which generally correspond to antennas as illustrated in FIGS. 3A-3B, and blocks as described above with respect to FIG. 6. The high field detector 702 also includes a microprocessor 710 analogous to the microprocessor 608 of FIG. 6, and a similar electromagnetically shielded enclosure (represented by dotted line 702).

In comparison to the system 600 of FIG. 6, rather than including a communication interface in this arrangement, the detector 702 is mounted directly to an enclosure 704, such that a computing system 712 can be placed within an electromagnetically shielded enclosure or rack system, and can monitor the detector 702 as previously explained. In the embodiment shown, the detector 702 can be mounted to the enclosure by using a radio frequency (RF) gasket 714 at a waveguide beyond cutoff opening in the enclosure to allow electrical communication between the microprocessor 710 of the detector 702 and the computing system 712 within the enclosure. The radio frequency gasket 714 is, in the embodiment shown, sized and positioned to prevent electromagnetic signals from penetrating the electromagnetically shielded enclosure past the waveguide beyond cutoff opening, which allows electrical communication into the enclosure 704.

In various embodiments, the electrical connection 716 between these components can be an RS-232 or RJ-45 style differential signal communicative connection. Additionally, as illustrated, power can be communicated through the RF gasket 714 and into the detector 702, such that the detector need not include a contained maintenance block, as disclosed in the system 600 of FIG. 6.

The enclosure 704 can be any of a number of styles of electromagnetically-shielding enclosures, and preferably shields from high field events, such as those detected using the high field detector 702. In various embodiments, the enclosure can be manufactured based on the techniques and systems described in copending U.S. patent application Ser. No. 12/906,902, entitled "Modular Electromagnetically Shielded Enclosure", and filed on Oct. 18, 2010, the disclosure of which is hereby incorporated by reference in its entirety.

Although in the embodiment shown the high field detector 702 is mounted externally to the enclosure 704, in an alternative embodiment, the entire high field detector 702 and associated antennas 706*a-c* can be placed entirely within the enclosure 704, such that high field events would only be detected if the integrity of the enclosure itself is first breached. Other arrangements in which detectors are placed both internally and externally to the enclosure are possible as well.

As illustrated in the example detector arrangements of FIGS. 6-7, the use of a simple, inexpensive circuit allows a user to create electromagnetic event detection systems including redundant detectors for relatively low cost, and which can be used to detect electromagnetic events in various locations around a facility. Furthermore, although the antennas 604*a-c* and 706*a-c* of FIGS. 6-7 are exposed to high field events, those antennas only generate relatively low electrical responses to those fields, and can pass those low, "safe" signals to detector circuitry as described in connection with FIGS. 4-7.

Figure 8:
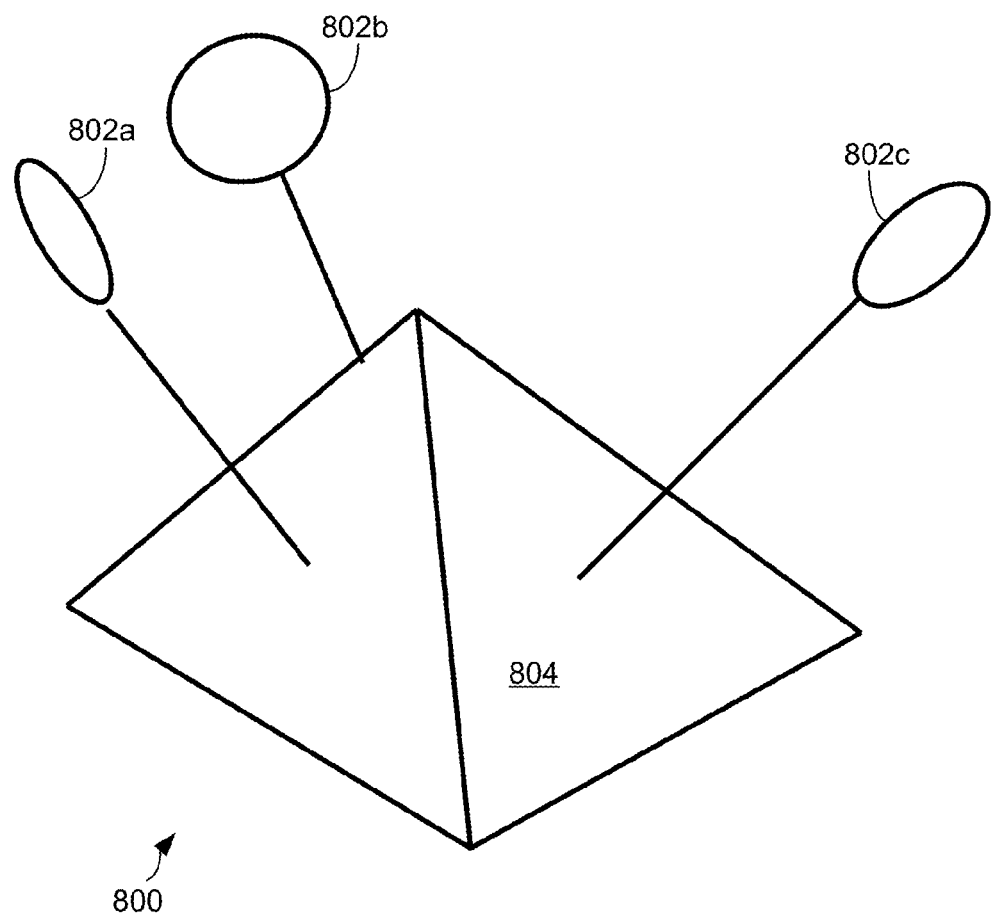
FIG. 8 is an example schematic depiction of an antenna structure useable in connection with the high field circuits discussed herein, according to a first possible embodiment.
Figure 9:
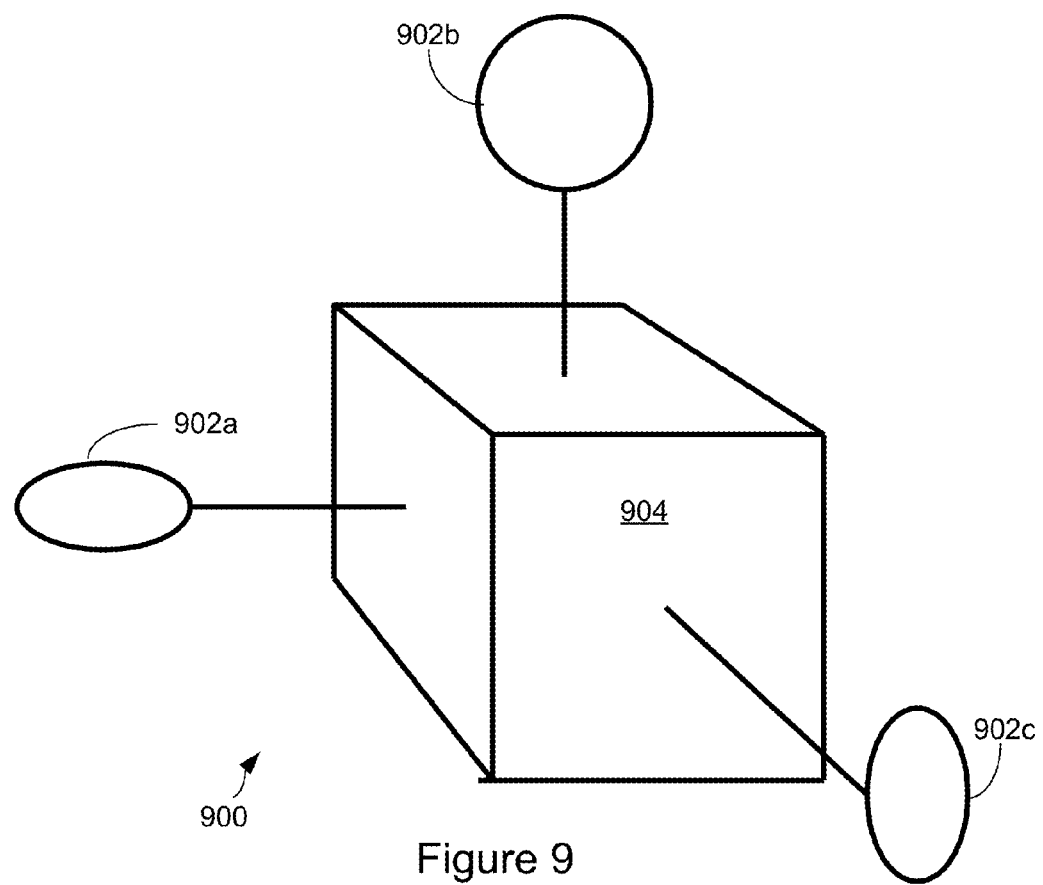
FIG. 9 is an example schematic depiction of an antenna structure useable in connection with the high field circuits discussed herein, according to a second possible embodiment.
Figure 10:
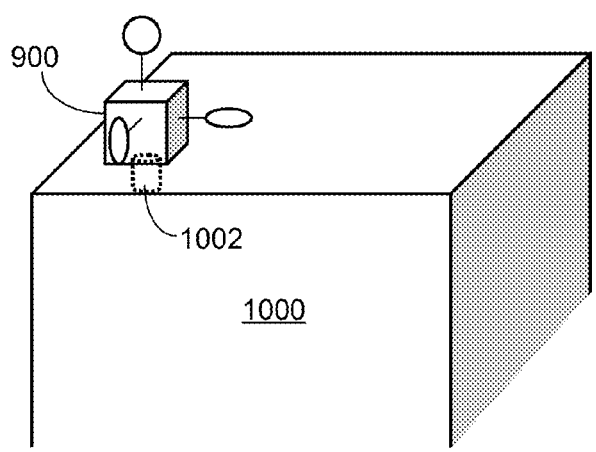
FIG. 10 is an example schematic depiction of an antenna structure mounted to an electromagnetically-shielded enclosure, according to a possible embodiment of the present disclosure.

Referring now to FIGS. 8-10, various structural arrangements of antennas and mechanical layouts for high field electromagnetic detection devices are illustrated. FIG. 8 is an example schematic depiction of an antenna structure 800 useable in connection with the high field circuits discussed herein, according to a first possible embodiment. In this embodiment, three antennas 802*a-c* are generally mounted on and extend from a pyramidal base 804. Each antenna 802*a-c* is in this embodiment a shielded loop magnetic antenna, and is oriented in direction and such that the loop is oriented normal to the direction of each of the other two antennas, to ensure a three-dimensional capture of magnetic fields near the antenna structure 800. Optionally, one or more circuits, such as the standard module described in FIGS. 4-5, could be included in the base 804 of the antenna structure 800, or an electrical connection can extend from the base 804 to such circuitry.

FIG. 9 illustrates a second example of an antenna structure 900 useable in connection with the high field circuits. In this embodiment, again three shielded loop magnetic antennas 902*a-c* are used, and each extends along an axis in a direction normal to the other two antennas, and has a loop that is oriented in a direction normal to the orientation of the other two loop antennas. The antennas 902*a-c* are mounted in this embodiment to a cubic or rectangular base 904, which can also house either one or more standard modules or other circuits for processing signals received at the antennas, or forwarding those signals to such circuits for processing.

Now referring to FIG. 10, an example schematic depiction of the antenna structure 900 of FIG. 9 is illustrated as mounted to an electromagnetically-shielded enclosure 1000 is shown. In this embodiment, a gasket 1002 is located on a bottom side of the base 900 adjoining the enclosure 1000, to provide electrical communication through a waveguide-beyond-cutoff connection between circuitry in the base (e.g., the circuitry disclosed as included within the detector 702 of FIG. 7), and circuitry or computing systems within the enclosure 1000 (e.g., a computing system such as system 712 of FIG. 7).

Although the antenna structure 900 of FIG. 9 is illustrated as mounted on the enclosure 1000, it is recognized that other antenna structures, such as structure 800 of FIG. 8 could be used in connection with mounting a detector external to an enclosure. Other arrangements of antennas and antenna structures could be used as well.

Referring now to FIGS. 11-14, arrangements of devices and systems for detecting low field events are illustrated, according to various embodiments of the present disclosure. The embodiments illustrated in FIGS. 11-14 operate according to analogous principles to those of the high field event devices, but require less concern regarding shielding of (1) output data from the detector, and (2) input signals from an antenna, at least because the expected signals to which such devices and systems are exposed are not expected to cause immediate damage to those systems.

Figure 11:
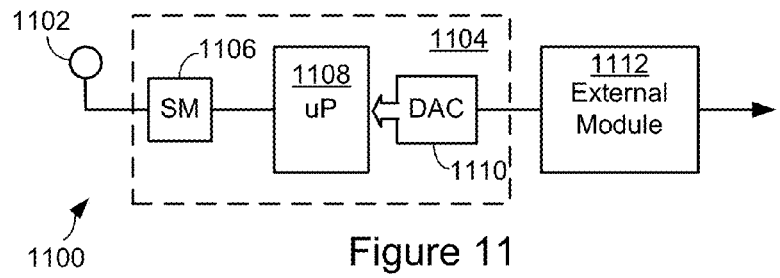
FIG. 11 is a schematic block diagram of a low field electromagnetic pulse detection system, according to a first possible embodiment of the present disclosure.
Figure 12:
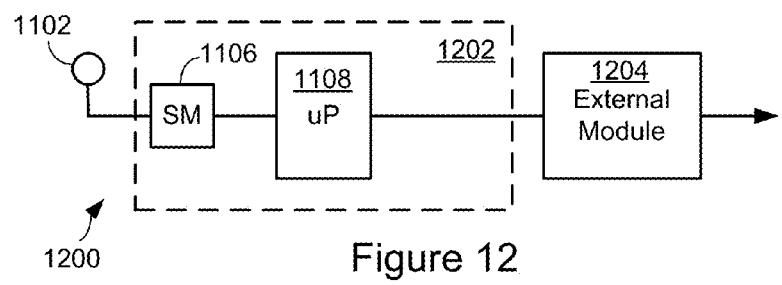
FIG. 12 is a schematic block diagram of a low field electromagnetic pulse detection system, according to a second possible embodiment of the present disclosure.

FIGS. 11-12 refer to arrangements in which a low field electromagnetic detector can be integrated with an existing communications module used for remote sensing. FIG. 11 is a schematic block diagram of a low field electromagnetic pulse detection system 1100, according to a first possible embodiment. The system 1100 includes an antenna 1102 interconnected to a low field detector device 1104. In the embodiment shown, the antenna can be an electrical antenna, such as a short monopole antenna, or other types of similar antennas. The detector device 1104 generally includes a single standard block 1106, which can correspond to the standard blocks disclosed in the circuits of FIGS. 4-5, above.

As with the high field detector arrangements of FIGS. 4-7, the low field detector device 1104 includes a microprocessor 1108 communicatively connected to the standard block 1106, which is capable of capturing and storing peak signal values for the electromagnetic field as observed at the antenna 1102.

In the embodiment shown, the low field detector device 1104 also includes a digital to analog converter 1110, which allows the device 1104 to communicate the captured data from the microprocessor 1108 to an external module module 1112 having an analog input data connection. In certain embodiments, the external module 1112 can be configurable to communicate with remote computing systems via a network or Internet connection, or via wireless connection. For example, the external module 1112 can be, in certain embodiments, a remote sensor monitoring and aggregation system. Other remote sensor monitoring and aggregation systems are useable as well.

FIG. 12 is a schematic block diagram of a second example low field electromagnetic pulse detection system 1200. The system 1200 generally includes an antenna 1102 interconnectable to a low field detector device 1202. The low field detector device 1202 includes a standard circuit module 1106 and microprocessor 1108, as in the system 1100 of FIG. 11. However, in contrast to detector device 1104 of FIG. 11, the device 1202 is configured to directly communicate with a digital external module 1204. As such, in this embodiment no digital to analog converter is required, and the communicative connection to the digital external module 1204 is also digital, rather than analog.

In both the arrangements of FIGS. 11 and 12, the communicative connection between the remote system (e.g., remote systems 1112, 1204) can also be configured to deliver power to the detector devices 1104, 1202, respectively. However, in alternative embodiments, those devices can be configured to include separate power connections, or can include circuitry to provide battery power to the circuitry within the standard circuit module 1106 and microprocessor 1108.

Figure 13:
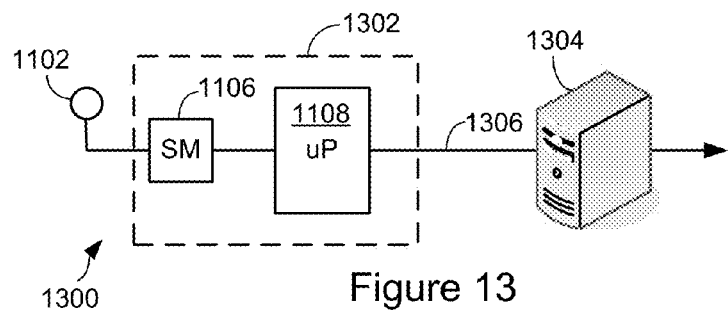
FIG. 13 is a schematic block diagram of a low field electromagnetic pulse detection system, according to a third possible embodiment of the present disclosure.
Figure 14:
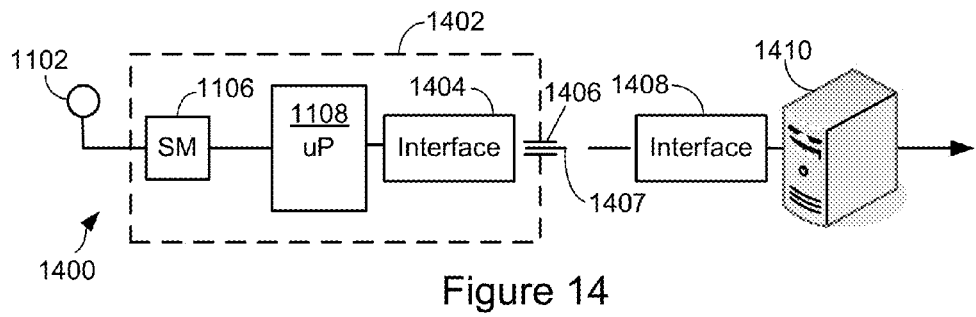
FIG. 14 is a schematic block diagram of a low field electromagnetic pulse detection system, according to a fourth possible embodiment of the present disclosure.

Referring now to FIGS. 13-14, additional arrangements of low field detection systems are illustrated in which the detector modules are arranged as a stand-alone system configured to communicate with a remote computing system, rather than using interconnection to an external module. FIG. 13 is a schematic block diagram of a low field electromagnetic pulse detection system 1300, which generally includes an antenna 1102 communicatively connected to a low field detector device 1302. The low field detector device 1302 generally corresponds to the same device 1202 of FIG. 12 (i.e., it also includes a standard circuit module 1106 and microprocessor 1108), but communicates to a remote computing system 1304 via a standardized communication connection 1306, which, in the embodiment shown, can be an RS-232 or RJ-45 twisted pair connection. Other network connections are possible as well.

FIG. 14 is a schematic block diagram of a low field electromagnetic pulse detection system 1400, according to a further possible embodiment. The low field electromagnetic pulse detection system 1400 includes an antenna 1102 communicatively connected to a low field detector device 1402, which includes a standard circuit module 1106 and microprocessor 1108, as well as a communication interface 1404. The communication interface 1404 is configured to convert communication signals between an electrical format associated with the microprocessor 1108 (e.g., the RS-232 or RJ-45 twisted pair signaling described in connection with FIG. 13) to signals of another media type (e.g., fiber optic signals). In this embodiment, the low field detector device 1402 also includes a waveguide beyond cutoff 1406 at a boundary of the low field detector device 1402, configured to filter extraneous signals on an associated optical fiber 1407 interconnecting the communication interface 1404 and a remote communication interface 1408, which is configured to provide a complementary optical-to-electrical conversion for communication of the signals to a remote computing systems 1410.

Referring to the low field detector arrangements of FIGS. 11-14 overall, it is recognized that each of these arrangements can also be used as stand-alone detectors or as integrated with one or more shielded enclosures, as described above with respect to the high field detectors of FIGS. 6-7. Additionally, use of the low-field detectors of FIGS. 11-14 entirely within an enclosure will provide additional advantages, because detection of any low field event within an enclosure could signify that the enclosure's electromagnetic shielding has somehow been compromised, and could signal that fact prior to exposure of any of the other electrical or electronic components within that enclosure to a potentially damaging high field event. For example, low field detectors could be used to indicate that some seal has failed on an enclosure, or that a door or other aperture to the enclosure remains ajar, or other analogous event has occurred. In some arrangements, a low field detector could be placed entirely within a shielded enclosure, and a complementary low level electromagnetic emitter could be placed outside of the enclosure. Upon breach of the shielded enclosure, the detector would determine the existence of the breach, due to the persistent electromagnetic fields present external to the enclosure due to the emitter.

Figure 15:
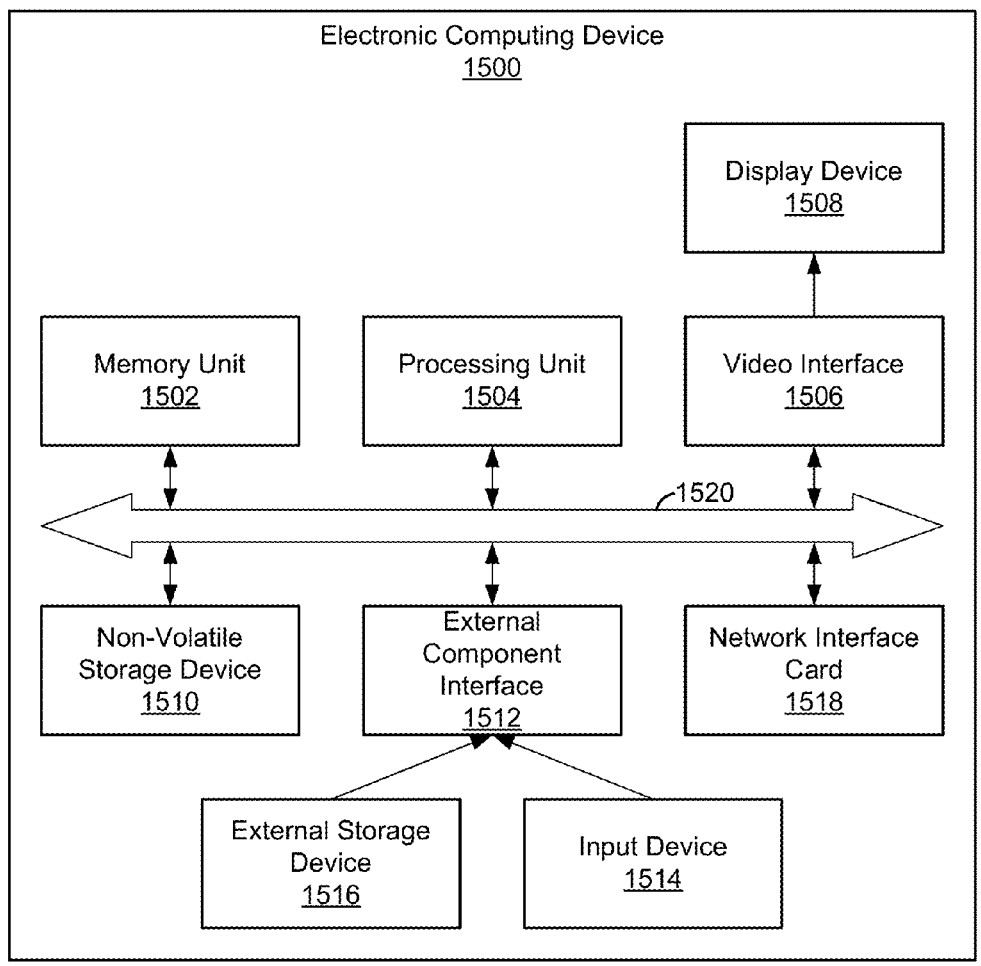
FIG. 15 is a schematic block diagram of an electronic computing device capable of forming aspects of the present disclosure.

FIG. 15 is a block diagram illustrating example physical components of an electronic computing device 1500, which can be used to execute the various operations described above, and provides an illustration of further details regarding any of the computing systems described above. A computing device, such as electronic computing device 1500, typically includes at least some form of computer-readable media. Computer readable media can be any available media that can be accessed by the electronic computing device 1500. By way of example, and not limitation, computer-readable media might comprise computer storage media and communication media.

As illustrated in the example of FIG. 15, electronic computing device 1500 comprises a memory unit 1502. Memory unit 1502 is a computer-readable data storage medium capable of storing data and/or instructions. Memory unit 1502 may be a variety of different types of computer-readable storage media including, but not limited to, dynamic random access memory (DRAM), double data rate synchronous dynamic random access memory (DDR SDRAM), reduced latency DRAM, DDR2 SDRAM, DDR3 SDRAM, Rambus RAM, or other types of computer-readable storage media. In addition, electronic computing device 1500 comprises a processing unit 1504. As mentioned above, a processing unit is a set of one or more physical electronic integrated circuits that are capable of executing instructions. In a first example, processing unit 1504 may execute software instructions that cause electronic computing device 1500 to provide specific functionality. In this first example, processing unit 1504 may be implemented as one or more processing cores and/or as one or more separate microprocessors. For instance, in this first example, processing unit 1504 may be implemented as one or more Intel Core 2 microprocessors. Processing unit 1504 may be capable of executing instructions in an instruction set, such as the x86 instruction set, the POWER instruction set, a RISC instruction set, the SPARC instruction set, the IA-64 instruction set, the MIPS instruction set, or another instruction set. In a second example, processing unit 1504 may be implemented as an ASIC that provides specific functionality. In a third example, processing unit 1504 may provide specific functionality by using an ASIC and by executing software instructions.

Electronic computing device 1500 also comprises a video interface 1506. Video interface 1506 enables electronic computing device 1500 to output video information to a display device 1508. Display device 1508 may be a variety of different types of display devices. For instance, display device 1508 may be a cathode-ray tube display, an LCD display panel, a plasma screen display panel, a touch-sensitive display panel, a LED array, or another type of display device.

In addition, electronic computing device 1500 includes a non-volatile storage device 1510. Non-volatile storage device 1510 is a computer-readable data storage medium that is capable of storing data and/or instructions. Non-volatile storage device 1510 may be a variety of different types of non-volatile storage devices. For example, non-volatile storage device 1510 may be one or more hard disk drives, magnetic tape drives, CD-ROM drives, DVD-ROM drives, Blu-Ray disc drives, or other types of non-volatile storage devices.

Electronic computing device 1500 also includes an external component interface 1512 that enables electronic computing device 1500 to communicate with external components. As illustrated in the example of FIG. 15, external component interface 1512 enables electronic computing device 1500 to communicate with an input device 1514 and an external storage device 1516. In one implementation of electronic computing device 1500, external component interface 1512 is a Universal Serial Bus (USB) interface. In other implementations of electronic computing device 1500, electronic computing device 1500 may include another type of interface that enables electronic computing device 1500 to communicate with input devices and/or output devices. For instance, electronic computing device 1500 may include a PS/2 interface. Input device 1514 may be a variety of different types of devices including, but not limited to, keyboards, mice, trackballs, stylus input devices, touch pads, touch-sensitive display screens, or other types of input devices. External storage device 1516 may be a variety of different types of computer-readable data storage media including magnetic tape, flash memory modules, magnetic disk drives, optical disc drives, and other computer-readable data storage media.

In the context of the electronic computing device 1500, computer storage media includes volatile and nonvolatile, removable and non-removable media implemented in any method or technology for storage of information such as computer readable instructions, data structures, program modules or other data. Computer storage media includes, but is not limited to, various memory technologies listed above regarding memory unit 1502, non-volatile storage device 1510, or external storage device 1516, as well as other RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that can be used to store the desired information and that can be accessed by the electronic computing device 1500.

In addition, electronic computing device 1500 includes a network interface card 1518 that enables electronic computing device 1500 to send data to and receive data from an electronic communication network. Network interface card 1518 may be a variety of different types of network interface. For example, network interface card 1518 may be an Ethernet interface, a token-ring network interface, a fiber optic network interface, a wireless network interface (e.g., WiFi, WiMax, etc.), or another type of network interface.

Electronic computing device 1500 also includes a communications medium 1520. Communications medium 1520 facilitates communication among the various components of electronic computing device 1500. Communications medium 1520 may comprise one or more different types of communications media including, but not limited to, a PCI bus, a PCI Express bus, an accelerated graphics port (AGP) bus, an Infiniband interconnect, a serial Advanced Technology Attachment (ATA) interconnect, a parallel ATA interconnect, a Fiber Channel interconnect, a USB bus, a Small Computer System Interface (SCSI) interface, or another type of communications medium.

Communication media, such as communications medium 1520, typically embodies computer-readable instructions, data structures, program modules or other data in a modulated data signal such as a carrier wave or other transport mechanism and includes any information delivery media. The term "modulated data signal" refers to a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer-readable media. Computer-readable media may also be referred to as computer program product.

Electronic computing device 1500 includes several computer-readable data storage media (i.e., memory unit 1502, non-volatile storage device 1510, and external storage device 1516). Together, these computer-readable storage media may constitute a single data storage system. As discussed above, a data storage system is a set of one or more computer-readable data storage mediums. This data storage system may store instructions executable by processing unit 1504. Activities described in the above description may result from the execution of the instructions stored on this data storage system. Thus, when this description says that a particular logical module performs a particular activity, such a statement may be interpreted to mean that instructions of the logical module, when executed by processing unit 1504, cause electronic computing device 1500 to perform the activity. In other words, when this description says that a particular logical module performs a particular activity, a reader may interpret such a statement to mean that the instructions configure electronic computing device 1500 such that electronic computing device 1500 performs the particular activity.

One of ordinary skill in the art will recognize that additional components, peripheral devices, communications interconnections and similar additional functionality may also be included within the electronic computing device 1500 without departing from the spirit and scope of the present invention as recited within the attached claims.

Figure 16:
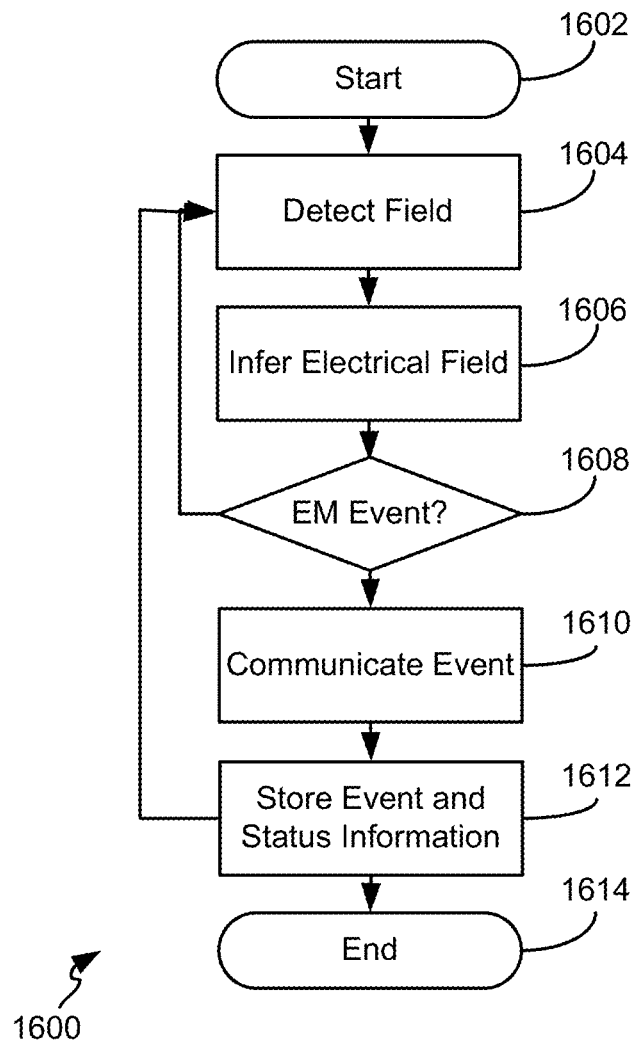
FIG. 16 is a flowchart of methods and systems for detecting an electromagnetic pulse event, according to a possible embodiment of the present disclosure.

FIG. 16 is a flowchart of methods and systems 1600 for detecting an electromagnetic pulse event, according to a possible embodiment of the present disclosure. Generally, the methods and systems can be performed at least in part using (1) a standard circuit block, as described herein, with respect to either low field or high field systems, and (2) a microprocessor or computing device communicatively connected to the standard circuit block and configured to analyze peak values obtained using the circuit block, as described above.

In the embodiment shown, the methods and systems are instantiated at a start operation 1602, which corresponds to initial setup of one or more detectors at a facility or other location to be monitored, as well as connection of the one or more detectors to other computing devices configured to coordinate detection and analysis of high field and/or low field electromagnetic events, such as EMP/IEMI events.

A field detection operation 1604 corresponds to detection of a field at an antenna that is interconnected with a standard block. As previously described, the field detection operation 1604 can correspond to detection of one or more directional components of a magnetic field using one or more oriented shielded loop magnetic antennas, as described above in connection with high field detection systems in FIGS. 3A-3B and FIGS. 4-10. Alternatively, the field detection operation 1604 can correspond to detection of an electrical field using a short monopole antenna, in the case of detection of a low field electromagnetic event, as described in connection with FIGS. 11-14.

An optional inferential operation 1606 infers an electrical field based on the reading obtained by the field detection operation 1604. The inferential operation 1606 will be performed in the case where a shielded loop magnetic antenna is used to detect a magnetic field, for example in the case of a high field detection system.

An electromagnetic event determination operation 1608 determines whether an electromagnetic event has occurred. Typically the electromagnetic event determination operation 1608 includes sampling a peak value detected using a standard circuit module and associated microprocessor, and performing one or more additional operations on that sample to determine whether a high or low field event occurs. For example, in the case of a high field event, the peak value may be summed or otherwise combined with other inferred electrical field values (e.g., by using the square root of a sum of squares) to arrive at an overall electromagnetic field value, and comparing that value to a preset known threshold, over which it is assumed that a high field event has occurred. In a further example, for low field events, the detected peak value can be directly compared to a known threshold value, and based on that comparison the existence of a low field event can be determined.

If no high or low field event is detected, operational flow can return to the field detection operation 1604 to continue monitoring the electrical and/or magnetic fields present at the detector. However, if a high or low field event is detected, operational flow proceeds to an event communication operation 1610, which communicates the event (e.g., including the field values and time at which the field values were captured) to either memory or a remote system for alarming or further analysis. A storage operation 1612 corresponds to storing the field values and time, as well as information derived from those values or otherwise associated with the detector (e.g., the conclusion regarding whether a high or low field event has occurred, status of one or more electrical or electronic systems associated with the detector, and other sensor information from other associated or interconnected sensors) at a computing system remote from the detector. Operational flow can then continue to the field detection operation 1604, resulting in continued monitoring of the electrical and magnetic fields present at the detector. An end operation 1614 corresponds to completed detection after a desired (e.g. preset or undetermined) amount of time.

Referring to FIG. 16 generally, it is recognized that aspects of the methods and systems can be performed at a detector, while other aspects can be performed at a remote computing system, such as a centralized detector management system (e.g. as illustrated above in connection with FIGS. 1-2).

Referring now to FIGS. 1-16 generally, it can be recognized that a number of advantages are realized using the techniques for inferring electrical fields and for detecting the existence of electromagnetic events as described herein. For example, using the shielded loop magnetic antennas, standard circuit blocks, data processing components, and associated structures described herein, a low-cost, comprehensive monitoring system can be constructed for protection of electrical equipment at any of a variety of facility types where data protection is a priority.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An electromagnetic pulse (EMP) and intentional electromagnetic interference (IEMI) event detection system comprising:
   an electromagnetically shielded enclosure; and
   a detector configured to detect an EMP or IEMI event, the detector comprising:
      an antenna configured to capture signals representing at least a portion of a far field magnetic field generated from an EMP or IEMI event, the EMP or IEMI event having an electric field amplitude between 10 volts/meter and 100,000 volts/meter and a frequency of between 1 MHz to 10 GHz;
      a circuit electrically connected to the antenna, the circuit including:
      an equalizer communicatively connected to the antenna via a direct current isolation circuit, the equalizer outputting signals having an amplitude independent of frequencies of detected signals, the equalizer compensating for differentiating frequency response of the antenna;
      a logarithmic amplifier electrically connected to the equalizer and configured to generate a range of signals based on signals received at the antenna; and
      a peak detector receiving signals from the logarithmic amplifier and configured to capture a peak value of the signals;
   wherein an EMP or IEMI event is detected at least in part based on the peak value.

2. The EMP and IEMI event detection system of claim 1, wherein the detector is located within the electromagnetically shielded enclosure.

3. The EMP and IEMI event detection system of claim 2, whereby detection of an EMP or IEMI event indicates that the electromagnetically shielded enclosure has been compromised.

4. The EMP and IEMI event detection system of claim 1, further comprising a microprocessor communicatively connected to the peak detector and configured to determine the existence of an EMP or IEMI event.

5. The EMP and IEMI event detection system of claim 1, further comprising a computing system configured to monitor the detector, the computing system configured to determine whether an EMP or IEMI event occurs based on a comparison of the peak value to a predetermined value.

6. The EMP and IEMI event detection system of claim 5, wherein, upon determination of an EMP or IEMI event, the computing system generates a notification.

7. The EMP and IEMI event detection system of claim 6, wherein the notification is a notification selected from the group consisting of:
   a door ajar notification;
   a compromised shielding notification; and
   an electronic equipment malfunction.

8. The EMP and IEMI event detection system of claim 1, wherein the detector resides external to the electromagnetically shielded enclosure.

9. The EMP and IEMI event detection system of claim 8, wherein the electromagnetically shielded enclosure includes an opening sized to receive an electrical cable connecting the circuit to a computing system within the electromagnetically shielded enclosure, the opening including a radio frequency gasket sized and positioned to prevent electromagnetic signals from penetrating the electromagnetically shielded enclosure through the opening.

10. An electromagnetic pulse (EMP) and intentional electromagnetic interference (IEMI) event detection apparatus comprising:
   a circuit configured to detect an EMP or IEMI event, the circuit comprising:
      an equalizer communicatively connected to an antenna via a direct current isolation circuit, the antenna configured to capture signals representing at least a portion of a far field magnetic field generated from an EMP or IEMI event, the EMP or IEMI event having an electric field amplitude between 10 volts/meter and 100,000 volts/meter and a frequency of between 1 MHz to 10 GHz, the equalizer outputting signals having an amplitude independent of frequencies of detected signals, the equalizer compensating for differentiating frequency response of the antenna;
      a logarithmic amplifier electrically connected to the equalizer and configured to generate a range of signals based on signals received at the antenna;
      a peak detector receiving signals from the logarithmic amplifier and configured to capture a peak value of the signals; and
      a microprocessor configured to detect an EMP and IEMI event at least in part based on the peak value; and
   a housing at least partially enclosing the circuit.

11. The EMP and IEMI event detection apparatus of claim 10, wherein the housing provides electromagnetic shielding around the circuit.

12. The EMP and IEMI event detection apparatus of claim 10, further comprising an antenna extending from the housing.

13. The EMP and IEMI event detection apparatus of claim 10, further comprising a communication interface communicatively connected to the microprocessor and positioned within the housing, the communication interface configured to translate electrical signals to optical signals for transmission on an optical fiber extending from the housing.

14. The EMP and IEMI event detection apparatus of claim 13, further comprising a waveguide beyond cutoff positioned at least partially within the housing and along the optical fiber.

15. The EMP and IEMI event detection apparatus of claim 10, further comprising a filtered signal wire extending from the housing and configured for communication with a remote computing system.

16. The EMP and IEMI event detection apparatus of claim 15, wherein the signal wire is an analog signal cable additionally configured to provide power to the circuit.

17. The EMP and IEMI event detection apparatus of claim 15, wherein the signal wire is a digital signal cable additionally configured to provide power to the circuit.

18. The EMP and IEMI event detection apparatus of claim 15, wherein the signal wire is selected from a group of signal wire types comprising:
an RS-232 cable;
a fiber optic cable; and
an RJ-45 twisted pair cable.

19. An electromagnetic pulse (EMP) and intentional electromagnetic interference (IEMI) event detector system comprising:
a plurality of detectors positioned at a plurality of locations at a facility, each of the plurality of detectors including:
an antenna configured to capture signals representing at least a portion of a far field magnetic field generated from an EMP or IEMI event, the EMP or IEMI event having an electric field amplitude between 10 volts/meter and 100,000 volts/meter and a frequency of between 1 MHz to 10 GHz;
a circuit electrically connected to the antenna, the circuit including:
an equalizer communicatively connected to the antenna via a direct current isolation circuit, the equalizer outputting signals having an amplitude independent of frequencies of detected signals, the equalizer compensating for differentiating frequency response of the antenna;
a logarithmic amplifier electrically connected to the equalizer and configured to generate a range of signals based on signals received at the antenna; and
a peak detector receiving signals from the logarithmic amplifier and configured to capture a peak value of the signals;
a detection system communicatively connected to each of the plurality of detectors, the detection system including one or more computing systems configured to receive information from the plurality of detectors regarding observed electromagnetic fields and further configured to detect the presence of an EMP and IEMI event at one or more of the detectors.

20. The EMP and IEMI event detector system of claim 19, wherein the detection system is configured to store the information from the plurality of detectors and the observed electromagnetic events.

21. The EMP and IEMI event detector system of claim 19, wherein the detection system is configured to communicate an alarm message to a remote monitoring system.

22. The EMP and IEMI event detector system of claim 19, wherein the circuit further includes a microprocessor configured to capture the peak value and periodically communicate one or more peak values to the detection system.

23. The EMP and IEMI event detector system of claim 19, wherein each of the plurality of detectors includes an electromagnetically shielded housing enclosing the circuit.

24. An electromagnetic event detection system comprising:
an electromagnetically shielded enclosure;
a detector configured to detect an electromagnetic field event, the detector comprising:
an antenna;
a circuit electrically connected to the antenna, the circuit including:
an equalizer communicatively connected to the antenna via a direct current isolation circuit, the equalizer compensating for differentiating frequency response of the antenna;
a logarithmic amplifier electrically connected to the equalizer and configured to generate a range of signals based on signals received at the antenna; and
a peak detector receiving signals from the logarithmic amplifier and configured to capture a peak value of the signals;
a computing system configured to monitor the detector, the computing system configured to detect whether an electromagnetic field event occurs based on a comparison of the peak value to a predetermined value;
wherein, upon determination of an electromagnetic event, the computing system generates a notification selected from the group consisting of:
a door ajar notification;
a compromised shielding notification; and
an electronic equipment malfunction.

25. An electromagnetic event detection apparatus comprising:
a circuit configured to detect an electromagnetic event, the circuit comprising:
an equalizer communicatively connected to an antenna via a direct current isolation circuit, the equalizer compensating for differentiating frequency response of the antenna;
a logarithmic amplifier electrically connected to the equalizer and configured to generate a range of signals based on signals received at the antenna;
a peak detector receiving signals from the logarithmic amplifier and configured to capture a peak value of the signals; and
a microprocessor configured to detect an electromagnetic field events at least in part based on the peak value;
a housing at least partially enclosing the circuit; and
a filtered signal wire extending from the housing and configured for communication with a remote computing system, wherein the signal wire is selected from a group of signal wire types comprising:
an RS-232 cable; and
an RJ-45 twisted pair cable.

* * * * *